(12) United States Patent
Janssen

(10) Patent No.: US 7,492,211 B2
(45) Date of Patent: Feb. 17, 2009

(54) OUTPUT DRIVER EQUIPPED WITH A SENSING RESISTOR FOR MEASURING THE CURRENT IN THE OUTPUT DRIVER

(75) Inventor: Hendrikus Johannes Janssen, Nijmegen (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 10/484,354

(22) PCT Filed: Jul. 22, 2002

(86) PCT No.: PCT/IB02/03159

§ 371 (c)(1),
(2), (4) Date: Jan. 20, 2004

(87) PCT Pub. No.: WO03/010891

PCT Pub. Date: Feb. 6, 2003

(65) Prior Publication Data

US 2005/0174151 A1    Aug. 11, 2005

(30) Foreign Application Priority Data

Jul. 25, 2001    (EP) .................................. 01202849

(51) Int. Cl.
*H03K 17/687* (2006.01)
(52) U.S. Cl. .................. 327/427; 327/434; 327/436; 327/437
(58) Field of Classification Search ......... 327/108–110, 327/112, 427, 430–432, 434, 436, 437
See application file for complete search history.

(56) References Cited

U.S. PATENT DOCUMENTS

| | | | | |
|---|---|---|---|---|
| 4,023,111 A * | 5/1977 | Mortensen | .................. | 330/283 |
| 4,459,498 A * | 7/1984 | Stengl et al. | ................ | 327/436 |
| 4,500,801 A * | 2/1985 | Janutka | ...................... | 327/377 |
| 4,841,166 A * | 6/1989 | Harnden | ..................... | 327/110 |
| 4,914,316 A * | 4/1990 | Rossi et al. | .................. | 327/538 |
| 4,943,737 A * | 7/1990 | Guo et al. | .................... | 327/542 |
| 5,391,997 A * | 2/1995 | Meyer et al. | ................ | 327/514 |
| 5,559,658 A * | 9/1996 | Cooper et al. | ................. | 361/56 |
| 5,744,878 A * | 4/1998 | Wachter et al. | ............ | 307/130 |
| 5,886,563 A * | 3/1999 | Nasila | ......................... | 327/423 |
| 6,066,979 A * | 5/2000 | Adams et al. | ............... | 327/540 |
| 6,509,781 B2 * | 1/2003 | Dufort | ........................ | 327/434 |

\* cited by examiner

*Primary Examiner*—Tuan Lam
(74) *Attorney, Agent, or Firm*—Peter Zawilski

(57) ABSTRACT

An electronic circuit has an output driver (DRV) for providing a driving signal ($U_O$). The output driver has a transistor (T) with a first main terminal, a second main terminal and a control terminal coupled to receive a control signal ($V_{cntrl}$), a power supply terminal ($V_{SS}$), an output terminal (OUT) for providing the driving signal ($U_O$) that is coupled to the second main terminal, and a sensing resistor ($R_m$) coupled between the power supply terminal ($V_{SS}$) and the first main terminal. The output driver (DRV) further has means for temporarily disabling the coupling between the control terminal and the control signal ($V_{cntrl}$) during a peak voltage across the sensing resistor ($R_m$). The means may have a circuit that has a unidirectional current behavior, such as a diode (D), in series with the control terminal of the transistor (T).

4 Claims, 2 Drawing Sheets

OUTPUT DRIVER EQUIPPED WITH A SENSING RESISTOR FOR MEASURING THE CURRENT IN THE OUTPUT DRIVER

The invention relates to an electronic circuit comprising an output driver for providing a driving signal, which output driver comprises a transistor with a first main electrode, a second main electrode and a control electrode coupled to receive a control signal, a supply terminal, an output terminal to provide the driving signal, which output terminal is coupled to the second electrode, and a sensing resistor which is coupled between the supply terminal and the first main electrode.

Such an electronic circuit is known from the general state of the art, as shown in FIG. 1 and FIG. 2. FIG. 1 shows an output driver DRV. Said output driver DRV receives a supply voltage between a supply terminal $V_{SS}$ and a further supply terminal $V_{DD}$, and provides an output voltage $U_0$ to an output terminal OUT. The output driver DRV comprises an output transistor T and a further output transistor $T_F$, which are controlled by, respectively, a control circuit CNTRL and a further control circuit $CNTRL_F$. The output transistor T and the further output transistor $T_F$ are arranged in series between the supply terminal $V_{SS}$ and the further supply terminal $V_{DD}$. The control circuit CNTRL supplies a binary control signal $V_{CNTRL}$. The further control circuit $CNTRL_F$ similarly supplies a control signal to the gate of the further transistor $T_F$ which is in phase with the control signal $V_{CNTRL}$. As a result, the transistors T and $T_F$ are alternately conducting or non-conducting. For certain applications it is desirable to know the current through the output driver DRV. For this purpose, in the general state of the art as shown in FIG. 1, a sensing resistor $R_M$ is arranged in series with the source of the field effect transistor T. If the field effect transistor T carries a current, a voltage is applied across the sensing resistor $R_M$, which is a measure of the current through the field effect transistor T, which current can be calculated using Ohm's law. The voltage across the resistor $R_M$ has the adverse effect, however, that it causes the gate-source voltage of the field effect transistor T to be reduced. As a result, the maximum driving power of the driver DRV is reduced. In accordance with the general state of the art, this problem is frequently solved by the circuit as shown in FIG. 2. This means that the sensing resistor $R_M$ is arranged in series only with the supply terminal $V_{SS}$, while the full control voltage $V_{CNTRL}$ is available between the gate and the source of the field effect transistor T. On the assumption that the further supply terminal $V_{DD}$ receives a positive voltage with respect to the supply terminal $V_{SS}$, the voltage across the resistor $R_M$ is negative with respect to ground, or with respect to the substrate if an integrated circuit is used. This is undesirable, in particular, when the resistor is used in an integrated circuit because signal processing of the measured voltage becomes much more complicated.

Therefore, it is an object of the invention to provide an electronic circuit with a driver, which is provided with a sensing resistor for measuring the current through the driver, wherein the available control voltage of the output transistor is reduced hardly, if at all, by the voltage across the sensing resistor, and wherein signal processing of the measured voltage is possible in a simple manner.

To achieve this object, the output driver further comprises means for rendering ineffective said coupling between the control electrode and the control signal during a peak voltage across the sensing resistor. Most of the time substantially no current flows through the transistor. Only for a comparatively short period of time, i.e. when the driving signal changes from a high logic value to a low logic value, a current of significant value flows through the transistor, thereby causing a peak voltage across the sensing resistor. During this peak voltage, the control electrode, or the gate if a field effect transistor is used, is decoupled from the control circuit that controls this control electrode most of the time. The ever-present intrinsic capacitance between gate and source of the transistor makes sure that the voltage difference between gate and source of the transistor remains substantially constant during this peak voltage across the sensing resistor. The potential on the gate of the transistor consequently exhibits a peak that corresponds to the peak voltage across the sensing resistor.

In an embodiment of an electronic circuit comprising an output driver in accordance with the invention said means comprises a unipolar circuit that is arranged in series with the control electrode of the transistor. This unipolar circuit makes sure that the coupling between the gate of the transistor and the control circuit is automatically interrupted as soon as the potential on the gate of the transistor approximates the maximum potential that can be supplied by the control circuit as a result of the peak voltage across the sensing resistor which also affects the gate of the transistor via its gate-source capacitance.

In an embodiment of an electronic circuit comprising an output driver in accordance with the invention the unipolar circuit comprises a diode. Said diode is a very simple implementation for the unipolar circuit.

In an embodiment of an electronic circuit comprising an output driver in accordance with the invention the output driver further comprises current means which are coupled between a further supply terminal and the control electrode of the transistor. The current means can be used to compensate for the possible slow leaking away of the gate-source voltage of the transistor during the time that the gate of the transistor is decoupled from the control circuit. The value of the current to be supplied by the current means is very small. Consequently, a significant increase in power dissipation of the output driver does not take place. As the value for this small current may easily be chosen to be slightly too high, the potential on the gate of the transistor can become impermissibly high. This can be precluded by providing the output driver with limiting means for limiting the potential on the control electrode of the transistor. Said limiting means can be equipped, for example, with a zener diode that is coupled between the gate of the transistor and the supply terminal, or between the gate and the source of the transistor.

These and other aspects of the invention are apparent from and will be elucidated with reference to the embodiments described hereinafter.

Figure 4:
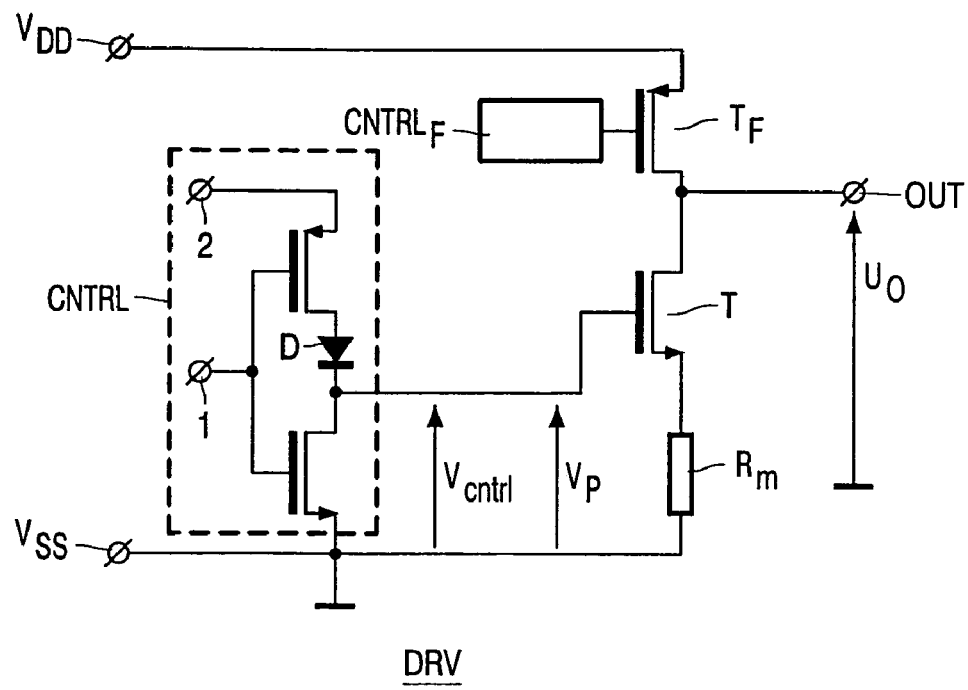
Figure 5:
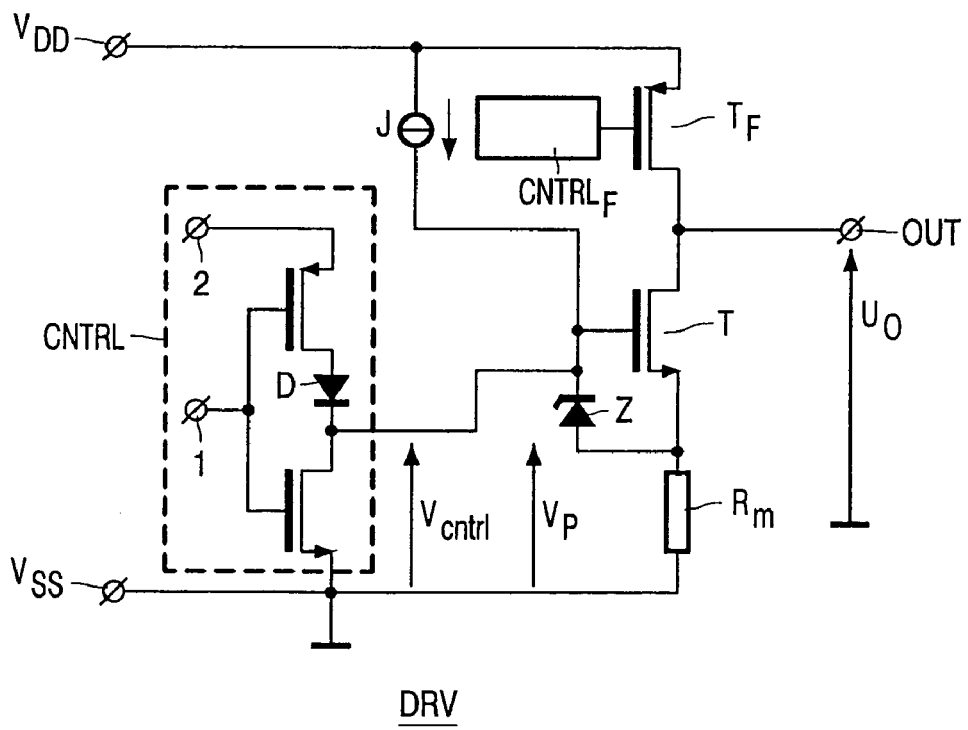

FIG. 4 shows a second embodiment of an electronic circuit comprising an output driver equipped with a sensing resistor for measuring the current through the output driver in accordance with the invention; and FIG. 5 shows a third embodiment of an electronic circuit comprising an output driver equipped with a sensing resistor for measuring the current through the output driver in accordance with the invention.

In these Figures, like reference numerals refer to like parts or elements.

Figure 1:
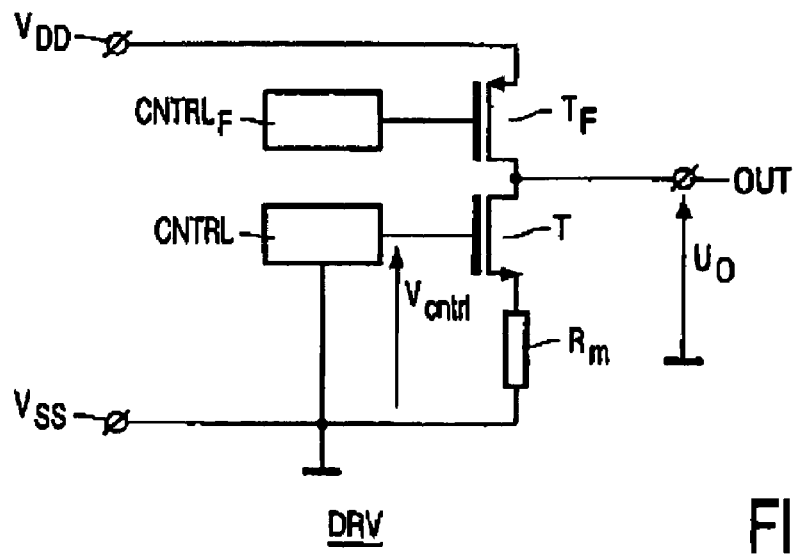
FIG. 1 shows a known electronic circuit comprising an output driver equipped with a sensing resistor for measuring the current through the output driver.
Figure 2:
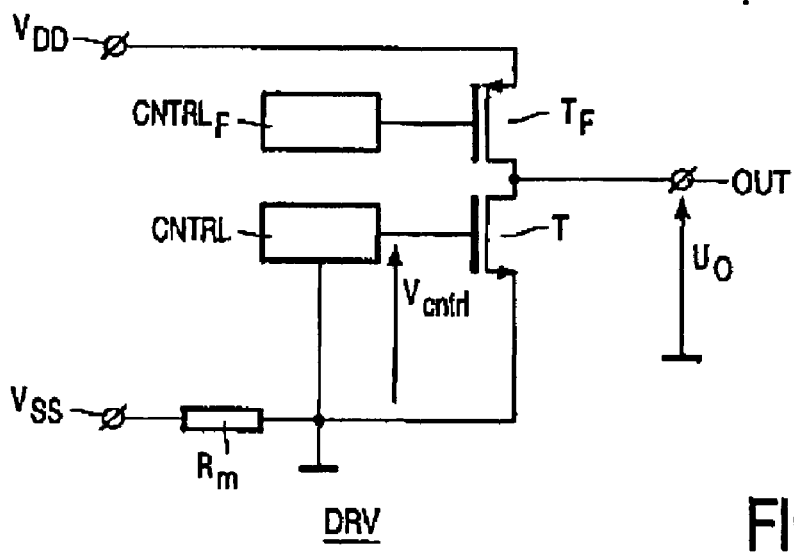
FIG. 2 shows an alternative, known electronic circuit comprising an output driver equipped with a sensing resistor for measuring the current through the output driver.
Figure 3:
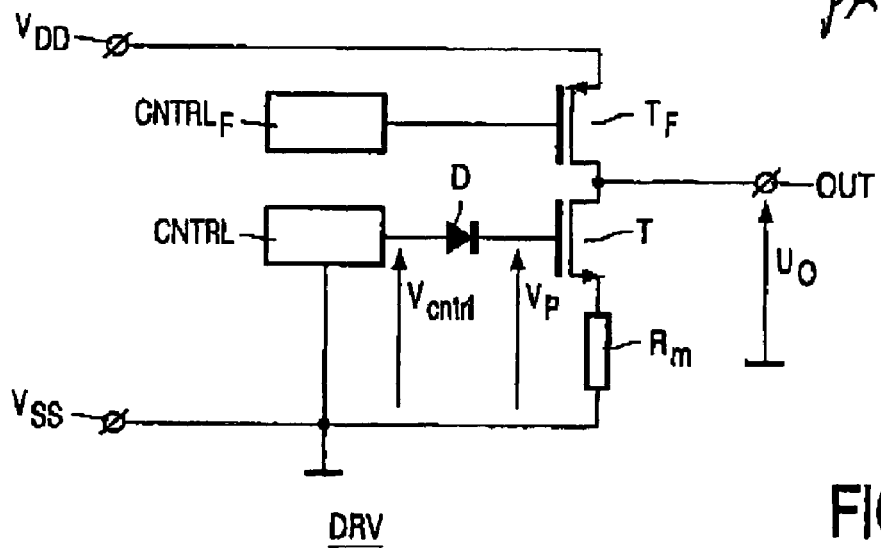
FIG. 3 shows a first embodiment of an electronic circuit comprising an output driver equipped with a sensing resistor for measuring the current through the output driver in accordance with the invention.

FIG. 3 shows a first embodiment of an electronic circuit including an output driver DRV comprising a supply terminal $V_{SS}$, a further supply terminal $V_{DD}$, an output field effect transistor T, a further output field effect transistor $T_F$, a control circuit CNTRL, a further control circuit $CNTRL_F$, a diode D, a sensing resistor $R_M$, and an output terminal OUT for supplying a driving signal $U_0$. The control circuit CNTRL supplies a control signal $V_{CNTRL}$ which can be supplied via the diode D to the gate of the transistor T. The further control circuit $CNTRL_F$ directly supplies a control signal to the further transistor $T_F$. The sensing resistor $R_M$ is coupled between the source of the transistor T and the supply terminal $V_{SS}$ that is also connected to ground. Like the drain of transistor $T_F$, the drain of transistor T is coupled to the output terminal OUT. The source of the further transistor $T_F$ is connected to the further supply terminal $V_{DD}$. Next, a description will be given of the operation of the circuit. On the assumption that no significant DC load is coupled to the output terminal OUT, the transistors T and $T_F$ will not carry current if the driving signal $U_0$ has a high logic value or a low logic value for a good length of time. The transistor T only carries current in the transition phase from the high to the low logic value of the driving signal $U_0$. As a result, the control signal $V_{CNTRL}$ would diminish in the known circuit in accordance with FIG. 1. This does not occur however in the circuit shown in FIG. 3. This can be attributed to the fact that at that instant the diode D is turned off. At said instant, the voltage $V_P$ between the gate of the transistor T and the supply terminal $V_{SS}$ is decoupled from the control voltage $V_{CNTRL}$. As a result, the potential on the gate will follow the potential on the source of the transistor T, so that the gate-source voltage of the transistor T remains substantially constant. This has the advantage that the maximum output current that can be drawn from the output terminal OUT in the transistor T is not limited.

FIG. 4 shows a second embodiment of an electronic circuit comprising an output driver DRV. The control circuit CNTRL is equipped with a conventional inverter comprising an N-type field effect transistor and a P-type field effect transistor, with the diode D of FIG. 3 being arranged, in this case, in series with the drain of said P-type field effect transistor. The terminal 1 receives the input signal, and terminal 2 receives a supply voltage. The operation of the circuit is similar to that of the circuit shown in FIG. 3. Most of the time, i.e. when there is no peak voltage across the sensing resistor $R_M$, the voltage between the gate and the source is determined by $V_{CNTRL}$, which is fully imposed by the control circuit CNTRL. During a peak voltage across the sensing resistor $R_M$, the diode D is reverse biased, as a result of which the signal between the gate and the source is not dictated by the control circuit CNTRL but by the transistor T itself. In this period, the voltage $V_P$ thus corresponds to the voltage $V_P$ as indicated in FIG. 3.

FIG. 5 shows a third embodiment of an electronic circuit comprising an output driver DRV. During the peak voltage across the sensing resistor $R_M$, the gate-source voltage of the field effect transistor T remains relatively constant as a result of the gate-source capacitance. However, the voltage decreases gradually as a result of leakage. This can be compensated for by using current means which, in FIG. 5, are implemented using the current source J that is coupled to the gate of the field effect transistor T. The current value supplied by the current source J must be very small. If the current value is too large, the potential on the gate of the field effect transistor T may become impermissibly high. To preclude this, a zener diode may be coupled between the gate and the supply terminal $V_{SS}$, or a zener diode may be coupled between the gate and the source of the field effect transistor T. The latter solution is preferred as it leads to a direct limitation of the gate-source voltage.

The electronic circuit in accordance with the invention can be applied in an integrated circuit or implemented in a discrete manner. Although field effect transistors are applied in all embodiments, it is alternatively possible to substitute, for example, the output transistor T with a bipolar transistor. In that case, the current value to be supplied by the current source J must be much higher in general. It is also possible to substitute all P-type transistors with N-type transistors, provided also all N-type transistors are replaced by P-type transistors, the diode's polarity is reversed, and the supply voltage polarity is reversed.

The invention claimed is:

1. An electronic circuit having an output driver for providing a driving signal, the output driver comprising:
    a supply terminal;
    a control circuit coupled to the supply terminal and configured and arranged to apply a voltage to a transistor control electrode;
    at least two transistors, each transistor having a first main electrode, a second main electrode and a control electrode, the second main electrode of each of the at least two transistors being coupled together, and the control electrode of at least one transistor being coupled to receive a control signal from the control circuit, and the first main electrode of said at least one transistor being coupled to the supply terminal;
    a sensing resistor coupled between the supply terminal and the first main electrode of said at least one transistor; and
    an output terminal coupled to the second main electrode to provide the driving signal, and
    a unipolar circuit between the control circuit and the control electrode of said at least one transistor to decouple the control electrode from the control circuit during a peak voltage condition across the sensing resistor, wherein the supply terminal is coupled to the control circuit during the peak voltage condition
    wherein the control circuit includes an inverter having an N-type field effect transistor and a P-type field effect transistor, the unipolar circuit arranged in series with a drain of the P-type field effect transistor.

2. An electronic circuit as claimed in claim 1, further comprising a further supply terminal and a current source coupled between the control electrode of the at least one transistor and the further supply terminal, wherein the current source supplies a current to the control electrode of the at least one transistor.

3. An electronic circuit as claimed in claim 2, further comprising a zener diode coupled between the control electrode of the at least one transistor and the supply terminal, wherein the zener diode limits a voltage between the control electrode of the at least one transistor and the first main electrode of the at least one transistor.

4. An electronic circuit having an output driver for providing a driving signal, the output driver comprising:
    at least two transistors, each transistor having a first main electrode, a second main electrode and a control electrode, the second main electrode of each of the at least two transistors being coupled together, and the control electrode of at least one transistor being coupled to receive a control signal;

a supply terminal;
an output terminal to provide the driving signal, the output terminal being coupled to the second main electrode;
a sensing resistor which is coupled between the supply terminal and the first main electrode of one transistor of the at least two transistors;
means for rendering ineffective said coupling between the control electrode and the control signal during a peak voltage across the sensing resistor, said means being a unipolar circuit arranged in series with the control electrode of the one transistor; and
a control circuit that supplies the control signal, the control circuit including an inverter having an N-type field effect transistor and a P-type field effect transistor, the unipolar circuit being arranged in series with a drain of the P-type field effect transistor.

* * * * *